(12) United States Patent
Hedaoo et al.

(10) Patent No.: US 8,543,893 B2
(45) Date of Patent: Sep. 24, 2013

(54) RECEIVER FOR ERROR-PROTECTED PACKET-BASED FRAME

(75) Inventors: Atul Kisanrao Hedaoo, Bangalore (IN); Rayesh Kashinath Raikar, Bangalore (IN)

(73) Assignee: Agere Systems LLC, Allentown, PA (US)

( * ) Notice: Subject to any disclaimer, the term of this patent is extended or adjusted under 35 U.S.C. 154(b) by 337 days.

(21) Appl. No.: 12/837,556

(22) Filed: Jul. 16, 2010

(65) Prior Publication Data

US 2011/0055666 A1    Mar. 3, 2011

(30) Foreign Application Priority Data

Sep. 2, 2009   (IN) .......................... 2125/CHE/2009

(51) Int. Cl.
*H03M 13/00*   (2006.01)

(52) U.S. Cl.
USPC ........................................................ 714/776

(58) Field of Classification Search
None
See application file for complete search history.

(56) References Cited

U.S. PATENT DOCUMENTS

| | | | |
|---|---|---|---|
| 5,870,412 A | 2/1999 | Schuster et al. | |
| 6,000,053 A | 12/1999 | Levine et al. | |
| 6,141,788 A | 10/2000 | Rosenberg et al. | |
| 6,226,769 B1 | 5/2001 | Schuster et al. | |
| 6,243,846 B1 | 6/2001 | Schuster et al. | |
| 6,445,717 B1 | 9/2002 | Gibson et al. | |
| 6,728,920 B1 | 4/2004 | Ebersman | |
| 6,851,084 B2 | 2/2005 | Pattavina | |
| 7,249,291 B2 * | 7/2007 | Rasmussen et al. | 714/701 |
| 7,409,627 B2 | 8/2008 | Kim et al. | |
| 2003/0226089 A1 * | 12/2003 | Rasmussen et al. | 714/758 |
| 2006/0259849 A1 * | 11/2006 | Conway | 714/776 |
| 2008/0049793 A1 * | 2/2008 | Yun et al. | 370/501 |
| 2009/0119566 A1 | 5/2009 | Hiromitsu et al. | |

FOREIGN PATENT DOCUMENTS

| | | |
|---|---|---|
| WO | WO2006099528 A1 | 9/2006 |
| WO | WO2008116121 A1 | 9/2008 |

OTHER PUBLICATIONS

European Search Report; Mailed Feb. 1, 2012 for corresponding EP Application No. 10174120.5.
Zheng, Z., et al., "XBC: XOR-Based Buffer Coding for Reliable Transmissions Over Wireless Networks"; IEEExplore; Sep. 18, 2007; XP002667784; Retrieved from the Internet: URL: http://ieeexplore.ieee.org/stamp/stamp.jsp?tp=&arnumber=4450409.

(Continued)

*Primary Examiner* — Guerrier Merant
(74) *Attorney, Agent, or Firm* — Mendelsohn, Drucker & Dunleavy, P.C.; David L. Cargille; Steve Mendelsohn (57) ABSTRACT

In one embodiment, a receiver for a frame of media packets employing the real-time transmission protocol (RTP) and forward error correction (FEC) is disclosed. The receiver comprises a packet buffer and an FEC decoder. After a packet is received by the packet buffer, the FEC decoder reads the packet and, as part of FEC processing, performs an XOR operation on the packet, without waiting for the entire frame (or, indeed, for any subsequent packet of the frame) to be received. The XOR operation results are accumulated until sufficient packets are received to reconstruct a missing packet in the frame. Because the XOR operations are performed immediately after a packet is received, without any delay from waiting for subsequent packets, the receiver has a very low latency, and the packet buffer may be relatively small.

14 Claims, 6 Drawing Sheets

(56) References Cited

OTHER PUBLICATIONS

Katti S. et al., "XORs in the Air: Practical Wireless Network Coding"; IEEE/ACM Transactions on Networking, IEEE/ACM New York, NY,; US, vol. 14, No. 3, Jun. 1, 2008; pp. 497-510; XP011226939.

StarPro 2612 Media Processor, LSI Product Brief, LSI Corporation, PB07-003DSP-1, Oct. 2006.

StarPro 2603 Media Processor, LSI Product Brief, LSI Corporation, PB07-002DSP-1, Oct. 2006.

Rosenberg, J. and Schulzrinne, H., "An RTP Payload Format for Generic Forward Error Correction," Network Working Group Request for Comments: 2733 Category: Standards Track, Columbia University, Dec. 1999, pp. 1-26.

European Examination Report; Mailed on Jan. 3, 2013 for EP Application No. 10174120.5.

* cited by examiner

RECEIVER FOR ERROR-PROTECTED PACKET-BASED FRAME

BACKGROUND OF THE INVENTION

1. Field of the Invention

The present invention relates to buffer-memory management in a receiver having an error-correction decoder, and, in particular, a forward-error-correction (FEC) decoder.

2. Description of the Related Art

FEC techniques are commonly used in packet-based networks, such as the Internet, to compensate for packet losses. An FEC technique suitable for use with real-time media packets employing the real-time transmission protocol (RTP) is described in U.S. Pat. No. 6,141,788 and in Internet standards track protocol no. RFC-2733, entitled "An RTP Payload Format for Generic Forward Error Correction," by J. Rosenberg et al., published December 1999 by The Internet Society, each of which is hereby incorporated by reference in its entirety. In accordance with this technique, an additional packet, called a checksum or FEC packet, is added to a media frame, or block of data packets, before transmission. At a receiver, a lost data packet in the frame can be recovered and reconstructed by combining the checksum packet with those data packets that were successfully received. More specifically, the lost data packet is recovered by performing a mathematical operation (e.g., an exclusive- or (XOR) logic operation) on the checksum packet and the successfully received data packets. The lost data packet may then be reconstructed from the results of the mathematical operations.

Figure 1:
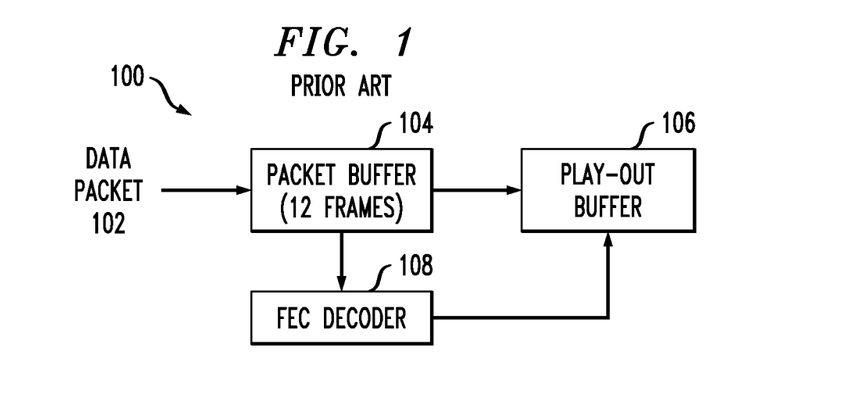
FIG. 1 is a simplified block diagram of a conventional receiver employing FEC decoding.

FIG. 1 depicts a conventional receiver 100 employing FEC decoding according to Internet standards track protocol no. RFC-2733. Receiver 100 includes a packet buffer 104 connected to an FEC decoder 108 and to a play-out buffer 106. FEC decoder 108 is also connected to play-out buffer 106.

Figure 2:
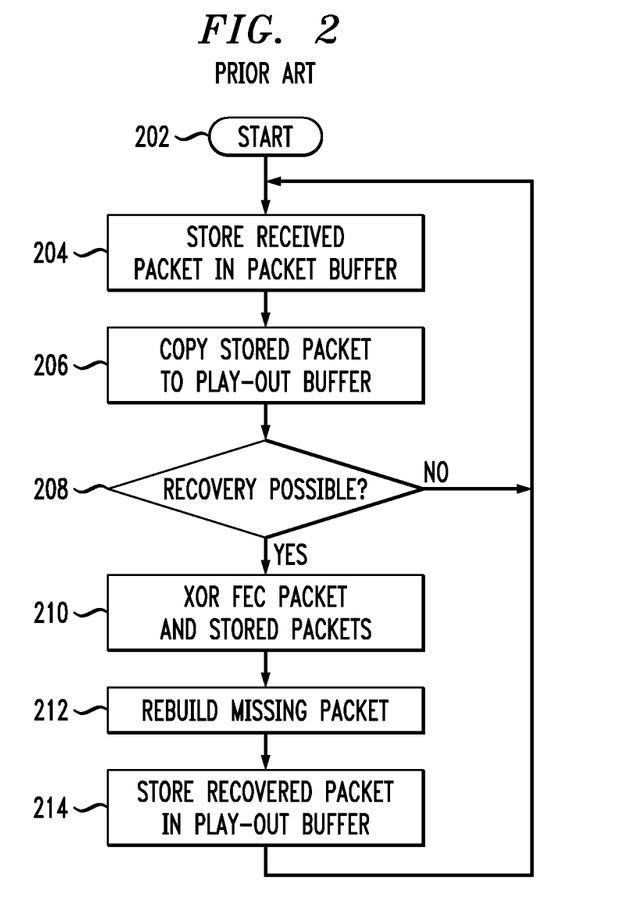
FIG. 2 is a flow chart illustrating the operation of the conventional receiver of FIG. 1.

FIG. 2 depicts the operation of conventional receiver 100. Operation begins in block 202. In block 204, a received packet 102 is stored in packet buffer 104. In block 206, a copy of packet 102 is transferred to play-out buffer 106; however, packet 102 is retained, in packet buffer 104 for subsequent processing by FEC decoder 108. In block 208, FEC decoder 108 determines whether the media frame F to which packet 102 belongs is ready for FEC decoding (e.g., when an FEC packet and all data packets except one have been received for a given media frame F). If not, operation returns to block 204, where a subsequent packet is received and stored. If, however, frame F is ready for FEC decoding, then, in block 210, FEC decoder 108 reads the received packets (i.e., all but one of the data packets and the FEC packet) for media frame F from packet buffer 104 and performs mathematical operations (e.g., XOR-logic operations) on the received packets. In block 212, FEC decoder 108 reconstructs the missing packet, based on the results of the mathematical operations, in accordance with well-known techniques. In block 214, FEC decoder 108 transfers the recovered packet to play-out buffer 106.

A disadvantage of conventional receiver 100, however, is the relatively large size of packet buffer 104. An MPEG media frame, for example, may have up to 24 data packets plus an FEC packet, for a total of 25 packets. As such, the amount MemPerFrame of buffer memory in packet buffer 104 that is required to store an MPEG media frame may be defined as follows:

$$MemPerFrame = \sum_{j=1}^{25} SizeOf(\text{Packet}(j))$$

Further, each packet may have a maximum size of the user-datagram-protocol (UDP) maximum packet size (e.g., 1.5 KB, the conventional Ethernet Maximum Transmission Unit (MTU) size). Thus, an MPEG media frame having 25 packets of size 1.5 KB would require 37.5 KB of memory.

In order to store m such frames, the total buffer memory required is (m×MemPerFrame). The number m of frames that must be stored in packet buffer 104 is a function of a number of variables, including (i) the latency of FEC decoder 108 (i.e., the time period between the receipt of a first packet of a frame and the start of FEC decoding for the frame), (ii) the FEC decoding delay (i.e., the time period from the start of FEC decoding to the completion of FEC decoding for the frame, including, e.g., performing 24 sets of XOR-logic operations for the frame), and (iii) the packet jitter of the incoming packets. In conventional receiver 100, the number m of frames to be stored in packet buffer 104 is typically between 12 and 30. Thus, if conventional receiver 100 is designed to receive MPEG media packets, then packet buffer 104 would conventionally require between 450 KB and 1.125 MB of memory.

Figure 3:
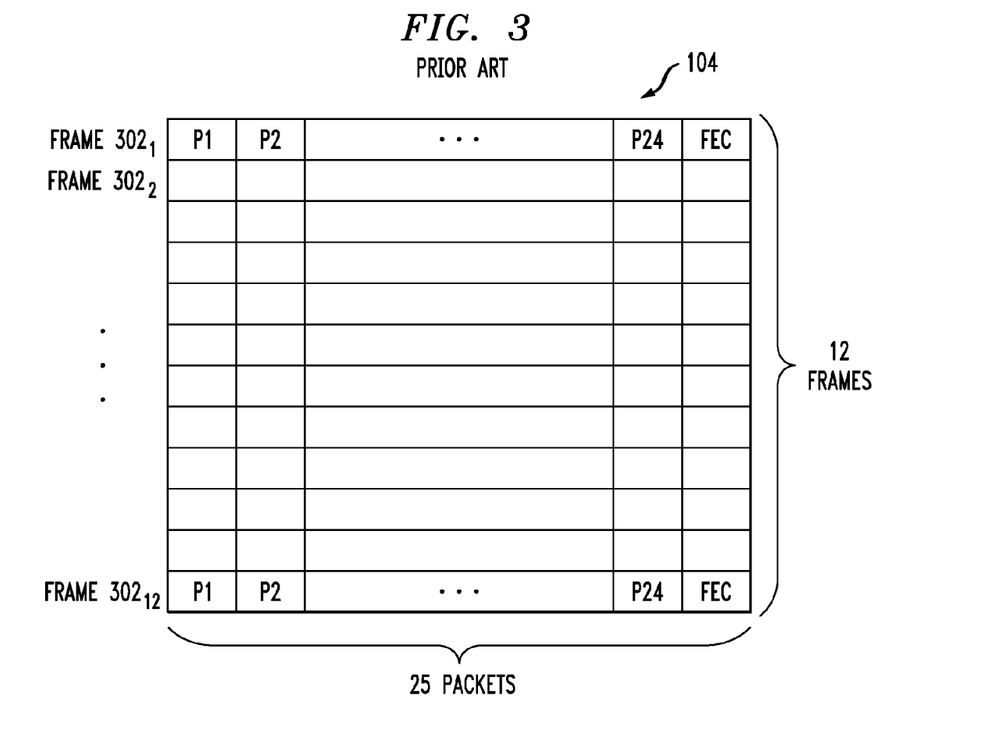
FIG. 3 is a graphical illustration of a packet buffer in the conventional receiver of FIG. 1.

For the sake of illustration, FIG. 3 graphically depicts an exemplary implementation of packet buffer 104, in which 12 media frames $302_1$-$302_{12}$ (having 25 packets each) may be stored.

SUMMARY OF THE INVENTION

An exemplary embodiment of the invention provides a receiver and method for FEC decoding, in which the latency of FEC decoding and the size of the packet buffer are significantly reduced.

Thus, in a first embodiment, the invention is a method for performing error-correction (EC) processing in a receiver. A subset of packets of a first frame comprising three or more data packets and an EC packet is serially received. EC processing is performed on the subset of packets of the first frame to reconstruct at least one packet of the first frame. The EC processing is initiated before the entire subset of packets is received.

In another embodiment, the invention is a receiver. The receiver comprises a packet buffer adapted to serially receive a subset of packets of a first frame comprising three or more data packets and an error-correction (EC) packet. The receiver further comprises an EC decoder adapted to perform EC processing on the subset of packets of the first frame to reconstruct at least one packet of the first frame, wherein the EC processing is initiated before the entire subset of packets is received.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Figure 4:
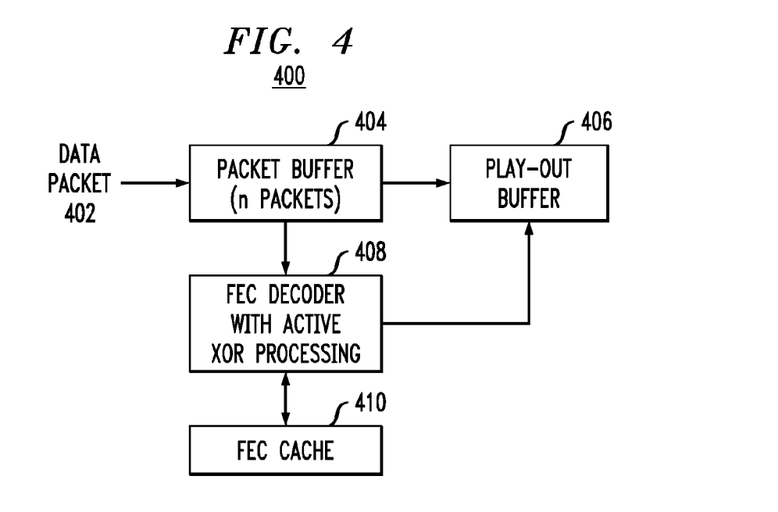
FIG. 4 is a simplified block diagram of an embodiment of a receiver employing FEC decoding in accordance with the present invention.

FIG. 4 depicts an embodiment of a receiver 400 in accordance with the present invention. As shown in FIG. 4, receiver 400 comprises packet buffer 404, play-out buffer 406, FEC decoder 408, and FEC cache 410. In receiver 400, FEC decoder 408 processes each received packet substantially in real-time, e.g., shortly after each packet arrives and is stored in packet buffer 404. FEC processing is initiated for each packet, even if the frame to which the packet belongs is incomplete. For this reason, FEC decoder 408 produces and maintains intermediate FEC-processing results that are stored in FEC cache 410. FEC decoder 408 updates the intermediate results stored in FEC cache 410 after each incoming packet is received and FEC processed. As such, FEC decoder 408 differs from prior-art FEC decoder 108 of FIG. 1, which waits until all but one of the data packets in a media frame have been received before commencing FEC processing.

Because FEC decoder 408 processes received packets substantially in real-time (without waiting for further packets in a frame to be received), packet buffer 404 may be significantly smaller than prior-art packet buffer 104 of FIG. 1. Packet buffer 404 stores a received packet only for as long as needed to (i) transfer the received packet to play-out buffer 406 and (ii) transfer the received packet to FEC decoder 408. After those transfers are completed, the memory in packet buffer 404 consumed by the received packet may be cleared and used for another incoming packet. As such, packet buffer 404 no longer is required to store all of the packets for a frame until the frame is deemed to be ready for FEC processing. Thus, play-out buffer 406 may be significantly smaller (e.g., by a factor ranging from about 2 to about 10) than play-out buffer 106.

For example, in one embodiment, play-out buffer 406 may be sized to allow storage of between about 12 to about 24 packets (which packets may belong to 12 different consecutively transmitted frames), and FEC decoder 408 is adapted to FEC process packets for the 12 consecutively transmitted frames. It should be understood, however, that the number of packets that packet buffer 404 and the number of frames that FEC decoder 408 are designed to handle may be varied, based on the packet jitter in the packet-based network, the latency of FEC decoder 408, and the processing delay of FEC decoder 408.

For the sake of simplicity, it will be assumed below that, in one embodiment, receiver 400 is designed for use in a communication system having a packet jitter that is sufficiently small to permit FEC decoder 408 to operate on packets belonging to three consecutively transmitted media frames at a time. In such an embodiment, FEC cache 410 comprises, inter alia, three memory locations fec_str$_1$, fec_str$_2$, and fec_str$_3$ (not shown in FIG. 4) for storing intermediate mathematical results (e.g., XOR-logic operation results) for the three consecutively transmitted media frames (referred to below as the previous frame $F_1$, the current frame $F_2$, and the next frame $F_3$) and a memory location current_packet for storing the current received packet. It is further assumed below that the number of packets protected by an FEC frame is either predetermined or negotiated between the receiver 400 and a transmitter (not shown), in accordance with techniques known to persons of ordinary skill in the art.

Figure 5:
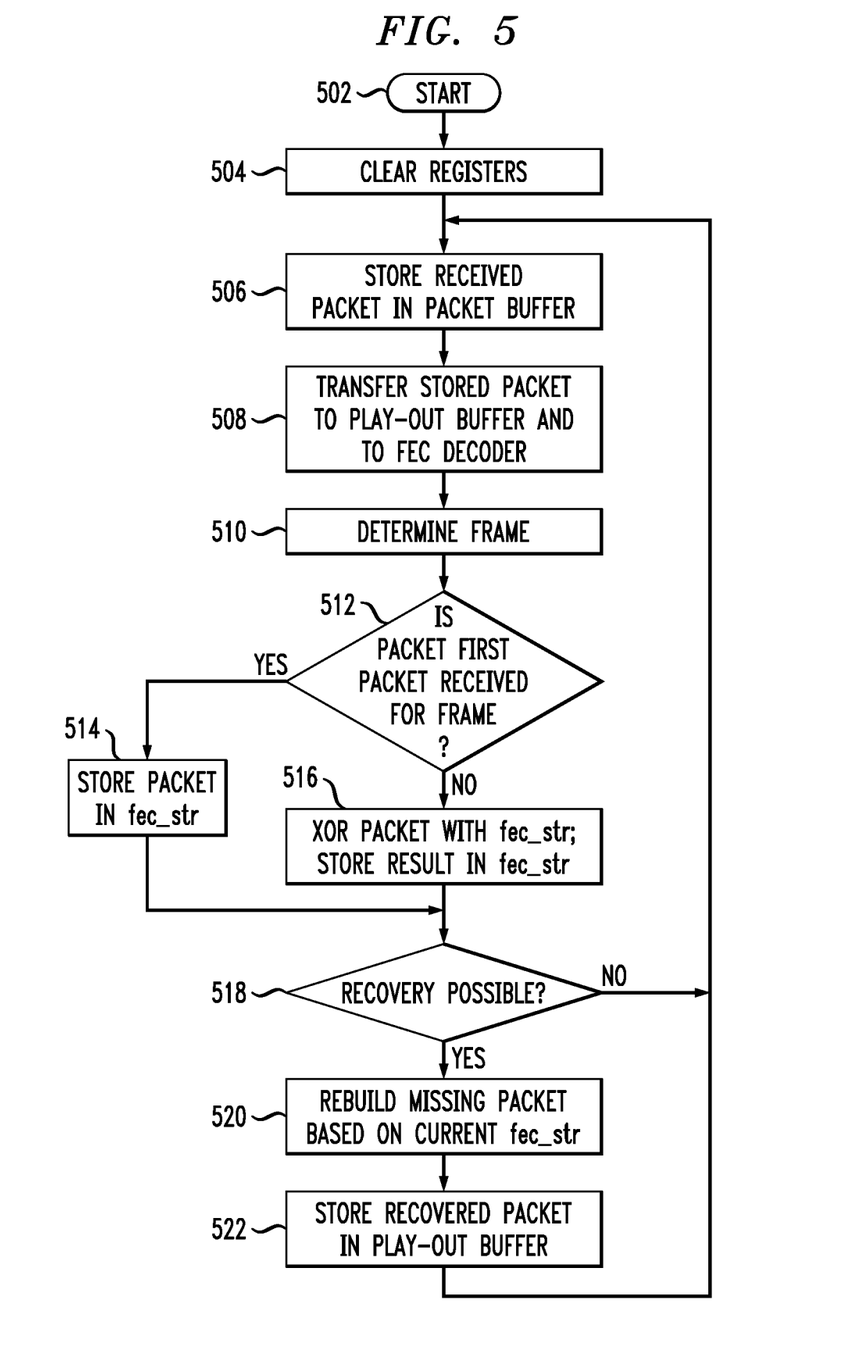
FIG. 5 is a flow chart illustrating the operation of the receiver shown in FIG. 4.

FIG. 5 depicts the operation of receiver 400. Operation begins in block 502. In block 504, memory locations fec_str$_1$, fec_str$_2$, and fec_str$_3$ are cleared (e.g., set to zero). In block 506, a received packet 402 is stored in packet buffer 404. In block 508, received packet 402 is transferred from packet buffer 404 to memory location current_packet in FEC cache 410 and to play-out buffer 406, and the memory location in packet buffer 404 that is occupied by received packet 402 is freed for other packets. In block 510, FEC decoder 408 reads header information for packet 402 and determines to which media frame (e.g., previous frame $F_1$) packet 402 belongs.

In block 512, FEC decoder 408 determines whether packet 402 is the first packet that receiver 400 has received for the media frame (e.g., previous frame $F_1$) to which packet 402 belongs. If so, in block 514, FEC decoder stores packet 402 in the memory location (fec_str$_1$, fec_str$_2$, or fec_str$_3$) corresponding to the media frame to which packet 402 belongs, and operation returns to block 506 to process another received packet. If packet 402 is not the first packet that receiver 400 has received for the media frame (e.g., previous frame $F_1$) to which packet 402 belongs, then in block 516, FEC decoder 408 performs a mathematical operation (e.g., an XOR-logic operation) between a data portion of packet 402 and the contents of the memory location (e.g., fec_str$_1$) corresponding to the media frame to which the packet belongs. The result of the mathematical operation is then stored in the same memory location (e.g., fec_str$_1$), thereby replacing the previous contents of the memory location.

In block 518, FEC decoder determines whether the media frame to which packet 402 belongs is ready for FEC decoding (e.g., when an FEC packet and all data packets except one have been received for the media frame). (Frame-determination block 518 is explained in more detail below with reference to FIG. 8.) If the frame to which packet 402 belongs is not ready for FEC decoding, then operation returns to block 506 to process another received packet.

If the media frame is ready for FEC decoding, then, in block 520, FEC decoder 408 uses the mathematical operation result stored in the memory location (e.g., fec_str$_1$) corresponding to the media frame (e.g., previous frame $F_1$) to which packet 402 belongs to reconstruct the missing packet, in accordance with well-known techniques, such as those described in U.S. Pat. No. 6,141,788 and in Internet standards track protocol no. RFC-2733. Finally, in block 522, FEC decoder 408 stores the recovered packet in play-out buffer 406, and the memory location (e.g., fec_str$_1$) is cleared for the next incoming frame.

Figure 6:
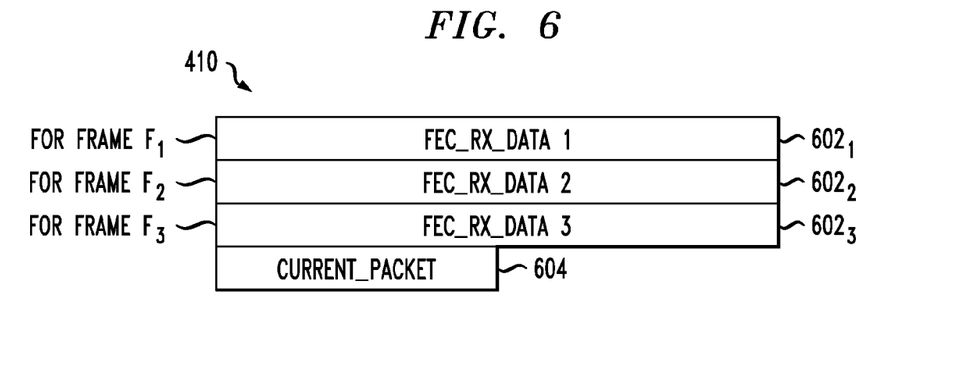
FIG. 6 is a graphical illustration of a packet buffer in the receiver shown in FIG. 4.

FIG. 6 is a graphical illustration of FEC cache 410. In one embodiment, FEC cache 410 comprises three data structures (or defined memory portions) $602_1$, $602_2$, and $602_3$ (identified respectively as FEC_RX_DATA1, FEC_RX_DATA2, and FEC_RX_DATA3) and a current_packet memory location 604 for storing the current received packet. In data structures (or defined memory portions) $602_1$, $602_2$, and $602_3$, FEC decoder 408 stores information that is useful for FEC decoding media frames $F_1$, $F_2$, and $F_3$, respectively.

In one embodiment, data structures $602_1$, $602_2$, and $602_3$ are defined as follows:

```
typedef struct FEC_RX_DATA
{
   uint16_t snmin;
   uint16_t snmax;
   uint8_t fec_str [MAX_RTP_PACKET_SIZE];
   uint16_t fstrlen;
   uint8_t fec_rec [MAX_RTP_PACKET_SIZE];
   uint16_t freclen;
   struct FEC_RX_DATA * prev;
   struct FEC_RX_DATA * next;
} FEC_RX_DATA_t;
``` where the data fields are defined as follows:

| | |
|---|---|
| Snmin | Minimum sequence number of the RTP media packets within the current frame $F_2$ |
| Snmax | Maximum sequence number of the RTP media packets within current frame $F_2$ |
| fec_str | Current result of XOR-logic operations on received RTP media packets belonging to current frame $F_2$ |
| Fstrlen | Payload length of RTP media packets belonging to current frame $F_2$<br>In one embodiment, the payload length of received packets may be stored in an XOR format (e.g., if packet 1 has a payload length of 9 bytes, and Packet 2 has a payload length of 8 bytes, then fstrlen = 8 XOR 9 = 1). |
| fec_rec | Received FEC packet belonging to current frame $F_2$ |
| Freclen | FEC packet length |
| Prev | Pointer to data structure for previous frame $F_1$ |
| Next | Pointer to data structure for next frame $F_3$ |

Figure 7:
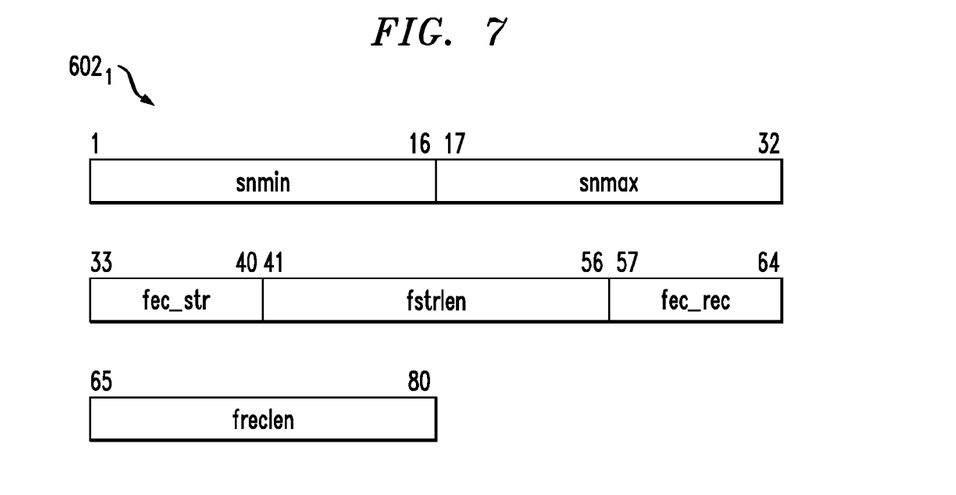
FIG. 7 is a graphical illustration of a portion of a cache memory including an FEC data structure in the receiver shown in FIG. 4.

For the sake of illustration, FIG. 7 graphically depicts data structure $602_1$.

Figure 8:
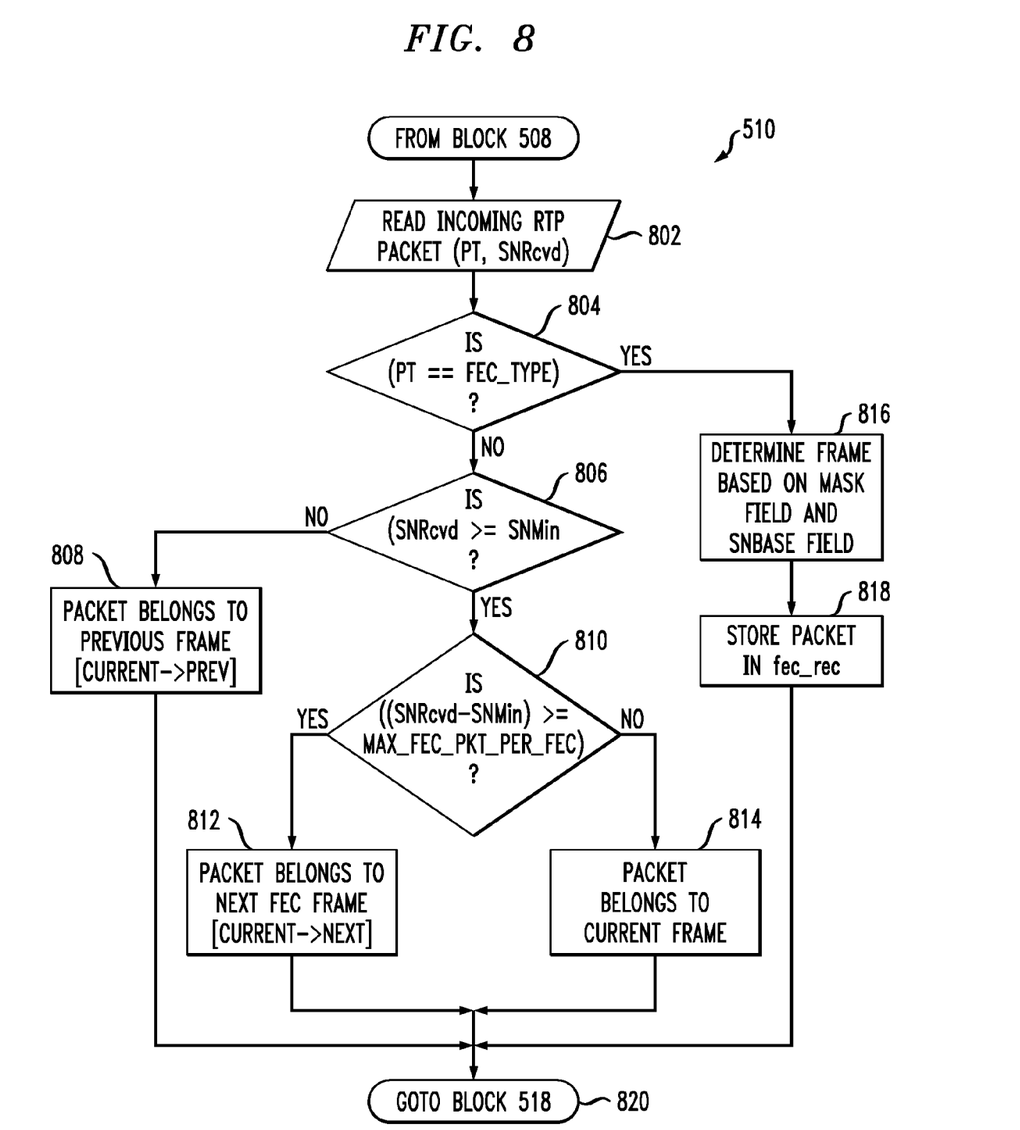
FIG. 8 is a more-detailed flow chart of the frame-determination block shown in FIG. 5.

FIG. 8 is a flow chart illustrating in more detail frame-determination block 510 of FIG. 5, in which FEC decoder 408 determines to which media frame (e.g., previous frame $F_1$) received packet 402 belongs.

In block 802, FEC decoder 408 reads a payload-type descriptor PT and a sequence number SNRcvd for received packet 402 stored in packet buffer 404 shown in FIG. 4. In block 804, FEC decoder 408 checks whether received packet 402 is an FEC packet (i.e., the payload-type descriptor PT equals a predetermined value FEC_TYPE). If received packet 402 is not an FEC packet, then operation continues in block 806. In block 806, FEC decoder 408 checks whether the sequence number SNRcvd is greater than or equal to the minimum sequence number snmin of the media packets within current frame $F_2$. If not, then, in block 808, FEC decoder 408 identifies received packet 402 as belonging to previous frame $F_1$, and a pointer is set to data structure $602_1$ (FEC_RX_DATA1), the defined memory location for storing FEC-decoding information relating to previous frame $F_1$. Operation continues in block Ii, where operation returns to block 516 in FIG. 5. In block 516, FEC decoder 408 uses the pointer to identify the data structure (e.g., FEC_RX_DATA1) having the memory location (e.g., fec_str$_1$) to be used in performing the mathematical operation on the data portion of packet 402.

If, however, in block 806, FEC decoder 408 determines that the sequence number SNRcvd is greater than or equal to the minimum sequence number snmin of the media packets within current frame $F_2$, then operation proceeds in block 810. FEC decoder 408 checks whether a difference of the received packet sequence number SNRcvd and the minimum sequence number snmin of the RTP media packets within the current frame $F_2$ is greater than or equal to a predetermined maximum number MAX_FEC_PKT_PER_FEC of packets that may be protected by an FEC packet. For example, for MPEG RTP media frames, the predetermined maximum number MAX_FEC_PKT_PER_FEC of packets that may be protected by an FEC packet is 24.

If the difference of the received packet sequence number SNRcvd and the minimum sequence number snmin of the RTP media packets within the current frame $F_2$ is not greater than or equal to (i.e., is less than) the predetermined maximum number MAX_FEC_PKT_PER_FEC, then, in block 814, FEC decoder 408 identifies received packet 402 as belonging to current frame $F_2$. In particular, a pointer is set to data structure $602_2$ (FEC_RX_DATA2), the defined memory location for storing FEC-decoding information relating to current frame $F_2$. Operation continues in block Ii, where operation returns to block 516 in FIG. 5. In block 516, FEC decoder 408 uses the pointer to identify the data structure (e.g., FEC_RX_DATA2) having the memory location (e.g., fec_str$_2$) to be used in performing the mathematical operation on the data portion of data packet 402.

Returning to block 810, if FEC decoder 408 determines that the difference of the received packet sequence number SNRcvd and the minimum sequence number snmin of the RTP media packets within the current frame $F_2$ is greater than or equal to (i.e., is not less than) the predetermined maximum number MAX_FEC_PKT_PER_FEC, then operation continues in block 812. FEC decoder 408 identifies received packet 402 as belonging to next frame $F_3$. In particular, a pointer is set to data structure $602_3$ (FEC_RX_DATA3), the defined memory location for storing FEC-decoding information relating to next frame $F_3$. Operation continues in block Ii, where operation returns to block 516 in FIG. 5. In block 516, FEC decoder 408 uses the pointer to identify the data structure (e.g., FEC_RX_DATA3) having the memory location (e.g., fec_str$_3$) to be used in performing the mathematical operation on the data portion of packet 402.

If, in block 804, FEC decoder 408 determines that received packet 402 is an FEC packet (i.e., the payload-type descriptor PT equals a predetermined value FEC_TYPE), then operation continues in block 816. In block 816, the mask field and the snbase field of packet 402 are used to determine to which frame (e.g., previous frame $F_1$, current frame $F_2$, or next frame $F_3$) packet 402 belongs. In block 818, packet 402 then is stored in the fec_rec memory location in the appropriate data structure (FEC_RX_DATA1, FEC_RX_DATA2, or FEC_RX_DATA3) in FEC cache 410, and, in block 820, operation returns to block 518 in FIG. 5.

Figure 9:
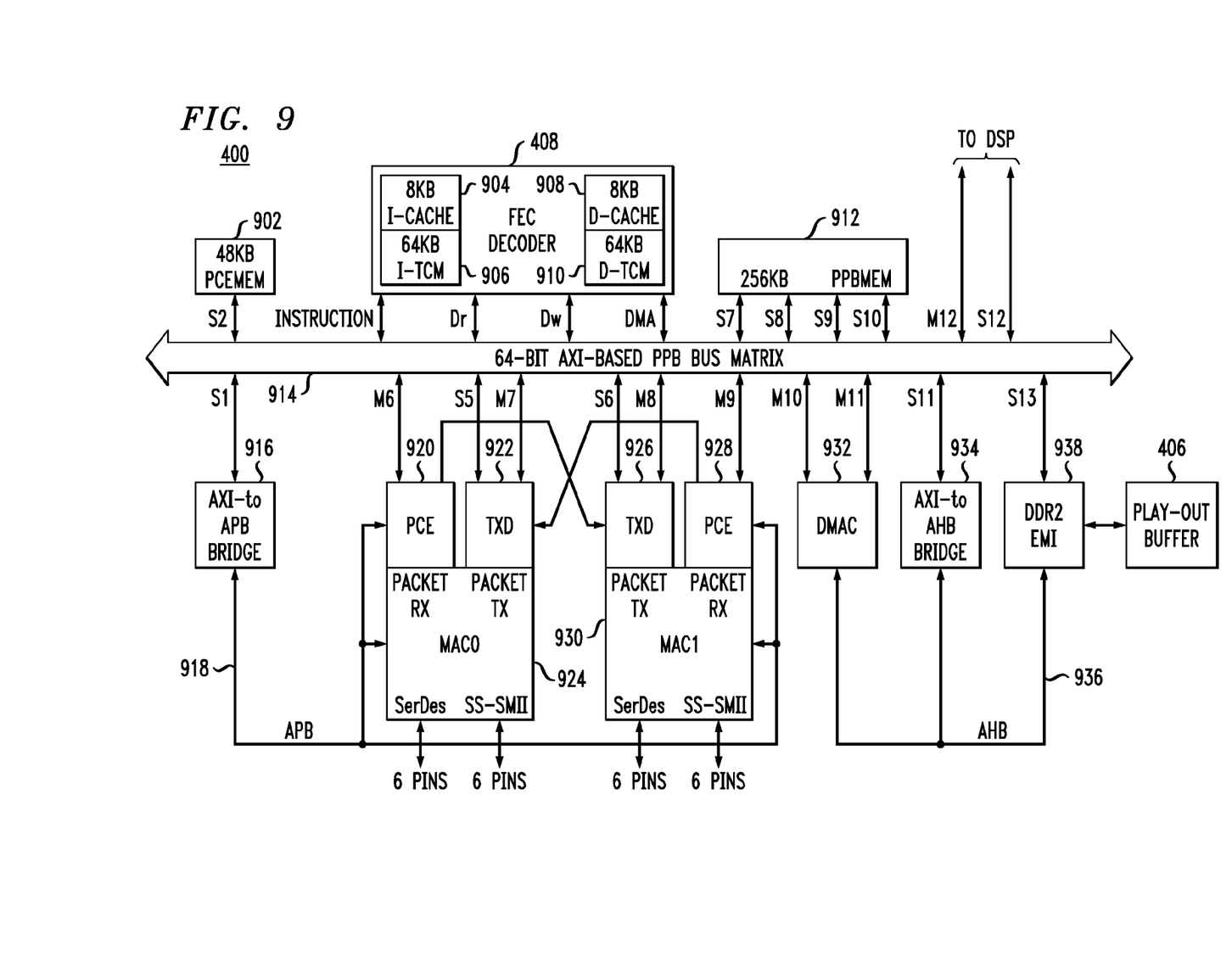
FIG. 9 is a more-detailed block diagram of the receiver shown in FIG. 4.

FIG. 9 is a more-detailed block diagram of receiver 400 shown in FIG. 4. FEC decoder 408 is preferably implemented as a reduced-instruction-set-computing (RISC) processor, such as an ARM1176J-S processor, based on a core design available from ARM Holdings plc, located in Cambridge, England. The RISC processor preferably operates at a speed of at least 250 MHz.

Packet buffer 404 and FEC cache 410 are preferably implemented within a 64 KB data tightly-coupled memory (D-TCM) 910 within the RISC processor. The RISC processor may also include an 8 KB data cache (D-cache), an 8 KB instruction cache (I-cache), and a 64 KB instruction tightly-coupled memory (I-TCM).

As shown in FIG. 9, play-out buffer 406 and FEC decoder 408 are connected via a 64-bit Advanced eXtensible Interface (AXI)-based bus matrix 914. Play-out buffer 406 is preferably an external double-data-rate (DDR) synchronous dynamic random access memory (SDRAM) (i) having a data transfer rate of 533 million data transfers per second, (ii) complying with the JEDEC Standard No. JESD79-2E, entitled "DDR2 SDRAM Specification," and (iii) implemented in an "×16" configuration (i.e., a DDR2-533×16 memory). Play-out buffer 406 is connected to bus matrix 914 through a DDR2 external memory interface (EMI) 938.

Receiver 400 also includes a 256 KB general-purpose SRAM memory ("PPBMEM") 912 for use by FEC decoder 408.

Receiver 400 also includes media access controllers (MACs) 924, 930 for providing Ethernet support. MACs 924, 930 are connected to bus matrix 914 through packet classification engine (PCE) co-processors 920, 928 and Transmit MAC DMA (TXD) co-processors. PCE co-processors 920, 928 provide L2/L3/L4 IP and UDP packet classification and direct-memory-access (DMA) support between MACs 924, 930 and packet buffer 404 for receive packets. TXD co-processors 922, 926 provide DMA support between MACs 924, 930 and transmit memory (not shown) for transmit packets. A 48 KB general-purpose SRAM memory 902 is also provided for PCE co-processors 920, 928, e.g., to store tables for Internet Protocol version 6 (IPv6) support.

Receiver 400 also includes a DMA controller 932 that provides DMA support for play-out buffer 406 (through external memory interface 938).

FEC decoder 408 preferably also communicates (i) with MACs 924, 930 and PCE co-processors 920, 928 through an advanced peripheral bus (APB) 918 connected via an AXI-to-APB bridge 916 and (ii) with DMA controller 932 and DDR2 external memory interface 938 through an advanced high-performance bus (AHB) 936 connected via an AXI-to-AHB bridge 934.

One or more digital signal processors (DSPs) (not shown) may also be connected to bus matrix 914 to decode media packets stored in play-out buffer 406.

There has thus been described a novel and innovative system and method for receiving a media frame having a plurality of data packets and an error-correction packet. It may be noted that, in above-described receiver 400 shown in FIG. 4, FEC decoder 408 performs a mathematical operation (e.g., an XOR-logic operation) on each received packet immediately, without delaying until all or most of the remaining packets in the corresponding media frame have been received. In contrast, in conventional receiver 100 shown in FIG. 1, FEC decoder 108 delays performing any mathematical operations until a buffered frame is determined to be ready for FEC decoding (e.g., until an FEC packet and all but one of the data packets for the frame have been received.) As such, FEC decoder 408 has a significantly smaller latency than conventional FEC decoder 108. Moreover, because FEC decoder 408 performs the mathematical operation on each received packet immediately, there is no need for packet buffer 404 to be capable of storing nearly all of the packets of each frame. As a result, packet buffer 404 may be much smaller in size than packet buffer 104 of FIG. 1.

The present invention may be implemented as an all-digital, all-analog, or a hybrid of both analog and digital circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, microcontroller, or general-purpose computer.

It will be further understood that various changes in the details, materials, and arrangements of the parts which have been described and illustrated in order to explain the nature of this invention may be made by those skilled in the art without departing from the scope of the invention as expressed in the claims below.

Thus, although the invention has been described above with respect to error correction using the XOR-logic operation, the invention is not so limited, and other logic operations (e.g., the NOT-exclusive-OR (NXOR) logic operation) may be used. Moreover, the invention may be practiced using other error-correction (EC) algorithms based on mathematical operations other than logic operations, provided that such EC algorithms allow FEC processing to occur for each received packet without delay, e.g., without requiring all or substantially all of the packets in a frame to be present before EC processing is initiated.

Further, although the invention has been described above with respect to particular lengths and quantities, the invention is not so limited, and other lengths and quantities may be used. For example, the number of frames that FEC decoder 408 and packet buffer 404 are designed to handle, as well as the number of memory locations in FEC cache 410, may be increased or decreased, based on the packet jitter in the packet-based network and/or on the latency of FEC decoder 408. For example, in one embodiment of the invention, a two-frame packet buffer may be employed, rather than a three-frame packet buffer as described above. In such an embodiment, only two data structures $602_1$, $602_2$ would be needed in FEC cache 410, rather than three as described above.

In another embodiment, if the network packet jitter is very small, a one-frame packet buffer may be employed, and FEC cache 410 may comprise, or be composed of, a single data structure $602_1$. On the other hand, if the packet jitter is large, the FEC decoder 408 and packet buffer 404 may be designed to handle four (or more) frames, and a corresponding number of data structures would be needed in FEC cache 410. For example, it is anticipated that, if the packet jitter is as large as in the case of receiver 100 described above (where packet buffer 104 was designed to be capable of storing 12 frames), then NEC decoder 408 and packet buffer 404 may be designed to handle 12 frames as well, with 12 data structures in FEC cache 410.

It should also be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

We claim:

1. A method for performing error-correction (EC) processing in a receiver, the method comprising:
   (a) a receiver serially receiving a subset of packets of a first frame comprising three or more data packets and an EC packet
   (b) the receiver performing EC processing on the subset of packets of the first frame to reconstruct at least one packet of the first frame, wherein the EC processing is initiated before the entire subset of packets is received;
   (c) serially receiving a subset of packets of a second frame comprising three or more data packets and an EC packet; and (d) performing EC processing on the subset of packets of the second frame to reconstruct at least one packet of the second frame, wherein the EC processing of the second frame is initiated before completion of the EC processing of the first frame.

2. The invention of claim 1, wherein the EC processing comprises processing each packet in the subset upon receipt without waiting to receive a subsequent packet in the subset.

3. The invention of claim 2, wherein, for at least one received packet in the subset, the EC processing comprises:
   (b1) performing a mathematical operation on the received packet and a value stored in a memory; and
   (b2) storing a result of the mathematical operation as the value stored in the memory for a subsequent mathematical operation.

4. The invention of claim 3, wherein, for the last received packet in the subset, the EC processing comprises:
   (b3) performing a last mathematical operation on the last received packet and the value stored in the memory; and
   (b4) reconstructing a missing data packet of the first frame based on a result of the last mathematical operation.

5. The invention of claim 1, wherein the EC processing of the first frame is initiated before initiation of the EC processing of the second frame.

6. The method of claim 1, further comprising:
   (a1) storing, in a packet buffer, each packet in the subset of packets of the first frame;
   (a2) reading each packet from the packet buffer before performing EC processing on the packet; and
   (c) storing a reconstructed packet in the packet buffer, after EC processing on each packet in the subset of packets of the first frame is completed.

7. A receiver comprising:
   a packet buffer adapted to serially receive a subset of packets of a first frame comprising three or more data packets and an error-correction (EC) packet; and
   an EC decoder adapted to perform EC processing on the subset of packets of the first frame to reconstruct at least one packet of the first frame, wherein the EC processing is initiated before the entire subset of packets is received.

8. The invention of claim 7, wherein the EC decoder is adapted to perform EC processing on each packet in the subset upon receipt without waiting for the packet buffer to receive a subsequent packet in the subset.

9. The invention of claim 8, wherein:
   the receiver further comprises a memory; and
   the EC decoder is adapted, for at least one received packet in the subset, to:
      perform a mathematical operation on the received packet and a value stored in the memory; and
      store a result of the mathematical operation as the value stored in the memory for a subsequent mathematical operation.

10. The invention of claim 9, wherein, for the last received packet in the subset, the EC decoder is adapted to:
   perform a last mathematical operation on the last received packet and the value stored in the memory; and
   reconstruct a missing data packet of the first frame based on a result of the last mathematical operation.

11. The invention of claim 7, wherein:
   the packet buffer is adapted to serially receive a subset of packets of a second frame comprising three or more data packets and an EC packet; and
   the EC decoder is adapted to:
      perform EC processing on the subset of packets of the second frame to reconstruct at least one packet of the second frame, and
      initiate the EC processing of the second frame before completing the EC processing of the first frame.

12. The invention of claim 11, wherein the EC decoder is adapted to initiate the EC processing of the first frame before initiating the EC processing of the second frame.

13. The invention of claim 7, wherein:
   the packet buffer is adapted to store each packet in the subset of packets of the first frame;
   the EC decoder is adapted to read each packet from the packet buffer before performing EC processing on the packet; and
   the EC decoder is adapted to store a reconstructed packet in the packet buffer, after EC processing each packet in the subset of packets of the first frame.

14. An apparatus for performing error-correction (EC) processing in a receiver, the apparatus comprising:
   (a) means for serially receiving a subset of packets of a first frame comprising three or more data packets and an EC packet;
   (b) means for performing EC processing on the subset of packets of the first frame to reconstruct at least one packet of the first frame, wherein the EC processing is initiated before the entire subset of packets is received;
   (c) means for serially receiving a subset of packets of a second frame comprising three or more data packets and an EC packet; and
   (d) means for performing EC processing on the subset of packets of the second frame to reconstruct at least one packet of the second frame, wherein the EC processing of the second frame is initiated before completion of the EC processing of the first frame.

\* \* \* \* \*